United States Patent
Mao et al.

(10) Patent No.: US 8,933,544 B2
(45) Date of Patent: Jan. 13, 2015

(54) INTEGRATED CIRCUIT STACK WITH INTEGRATED ELECTROMAGNETIC INTERFERENCE SHIELDING

(75) Inventors: Duli Mao, Sunnyvale, CA (US); Hsin-Chih Tai, San Jose, CA (US); Yin Qian, Milpitas, CA (US); Tiejun Dai, Santa Clara, CA (US); Howard E. Rhodes, San Martin, CA (US); Hongli Yang, Saratoga, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 273 days.

(21) Appl. No.: 13/547,997

(22) Filed: Jul. 12, 2012

(65) Prior Publication Data

US 2014/0014813 A1    Jan. 16, 2014

(51) Int. Cl.
*H01L 23/552*    (2006.01)
*H01L 27/146*    (2006.01)

(52) U.S. Cl.
USPC ............ 257/659; 257/622; 257/E23.114; 257/E21.158; 257/E29.022; 438/608; 438/653

(58) Field of Classification Search
CPC .................. H01L 23/552; H01L 27/146
USPC ............ 257/659, 622, E23.114, E21.158, 257/E29.022; 438/608, 653
See application file for complete search history.

(56) References Cited

U.S. PATENT DOCUMENTS

| | | | |
|---|---|---|---|
| 4,785,341 A | 11/1988 | Ning et al. | |
| 6,703,714 B2 * | 3/2004 | Akram et al. | 257/778 |
| 6,730,540 B2 * | 5/2004 | Siniaguine | 438/107 |
| 6,927,432 B2 | 8/2005 | Holm et al. | |
| 2010/0060764 A1 | 3/2010 | McCarten et al. | |
| 2010/0103634 A1 * | 4/2010 | Funaya et al. | 361/761 |
| 2010/0148293 A1 * | 6/2010 | Jain et al. | 257/434 |
| 2010/0177227 A1 * | 7/2010 | Cieslinski | 348/302 |
| 2011/0171827 A1 * | 7/2011 | Farooq et al. | 438/653 |
| 2012/0061789 A1 | 3/2012 | Yang et al. | |
| 2012/0062777 A1 | 3/2012 | Kobayashi et al. | |
| 2012/0105696 A1 | 5/2012 | Maeda | |
| 2013/0264688 A1 * | 10/2013 | Qian et al. | 257/622 |

OTHER PUBLICATIONS

Rule-of-Thumb for Calculating Aperture Size, G. Fenical, Laird Technologies Tech Note #154, Mar. 2003.*

(Continued)

*Primary Examiner* — Thao X Le
*Assistant Examiner* — Sheng Zhu
(74) *Attorney, Agent, or Firm* — Blakely Sokoloff Taylor & Zafman LLP (57) ABSTRACT

An integrated circuit system includes a first device wafer having a first semiconductor layer proximate to a first metal layer including a first conductor disposed within a first metal layer oxide. A second device wafer having a second semiconductor layer proximate to a second metal layer including a second conductor is disposed within a second metal layer oxide. A frontside of the first device wafer is bonded to a frontside of the second device wafer at a bonding interface. A conductive path couples the first conductor to the second conductor through the bonding interface. A first metal EMI shield is disposed in one of the first metal oxide layer and second metal layer oxide layer. The first EMI shield is included in a metal layer of said one of the first metal oxide layer and the second metal layer oxide layer nearest to the bonding interface.

25 Claims, 8 Drawing Sheets

(56) References Cited

OTHER PUBLICATIONS

Kwon et al., "Wafer Bonding Using Low-K Dielectrics as Bonding Glue in Three-Dimensional Integration," Interconnections for Gigascale Integration, Rensselaer Polytechnic Institute, Troy, New York, 12180 (1 page).

Motoyoshi et al., "3D-LSI Technology for Image Sensor," Pixel 2008 International Workshop, Fermilab, Batavia, IL, Sep. 23-26, 2008 (14 pages).

Peng et al., "Fine-Pitch Bump-Less Cu-Cu Bonding for Wafer-On-Wafer Stacking and Its Quality Enhancement," Institute of Microelectronics, Nanyang Technological University, Singapore (5 pages).

U.S. Appl. No. 13/441,627, filed Apr. 6, 2012 (27 pages).

EP 13172952.7—Extended European Search Report, mailed Jan. 15, 2014 (11 pages).

* cited by examiner

INTEGRATED CIRCUIT STACK WITH INTEGRATED ELECTROMAGNETIC INTERFERENCE SHIELDING

BACKGROUND INFORMATION

1. Field of the Disclosure

The present invention relates generally semiconductor processing. More specifically, examples of the present invention are related to semiconductor processing of stacked integrated circuit systems.

2. Background

As integrated circuit technologies continue to advance, there are continuing efforts to increase performance and density, improve form factor, and reduce costs. The implementation of stacked three dimensional integrated circuits have been one approach that designers sometimes use to realize these benefits. The advances in wafer bonding with very precise alignments make it possible to fabricate stacked chips on wafer-level. The possible applications could include logic chip bonding to memory, image sensors, among others. This offers the advantage of smaller form factor, higher performance, and lower cost.

A key challenge when implementing stacked three dimensional complementary metal-oxide semiconductor ("CMOS") image sensors, which continue to get smaller and faster, relates to switching noise between the stacked three dimensional integrated circuits. Switching noise can be of particular concern to image sensors packaged in through-silicon vias ("TSV") technology. With such packages, a number of traces or signal lines are laid out on the bottom side of the package. These traces often connect vias on the outer perimeter to solder balls (pins) in the inner region. During sensor operation, if a pin switches rapidly between high low states, and its corresponding trace runs underneath a sensitive part of the image sensor (e.g., pixel array), then switching noise may be coupled into the image sensor circuitry. This coupled noise may degrade the quality or increase noise in the output image data. The noise contributed from a pin depends on the location of the trace, the run length below the image sensor, the frequency of the switching, and the current in the trace. However, the noise emanating from these traces can affect a portion of the image sensor and even potentially the whole image sensor.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to interconnecting stacked integrated circuit device wafers with electromagnetic interference shielding are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

The following is a detailed description of the terms and elements used in the description of examples of the present invention by referring to the accompanying drawings.

As will be shown, examples of a method and apparatus providing an integrated circuit system with stacked integrated circuit device wafers including integrated electromagnetic interference shielding are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
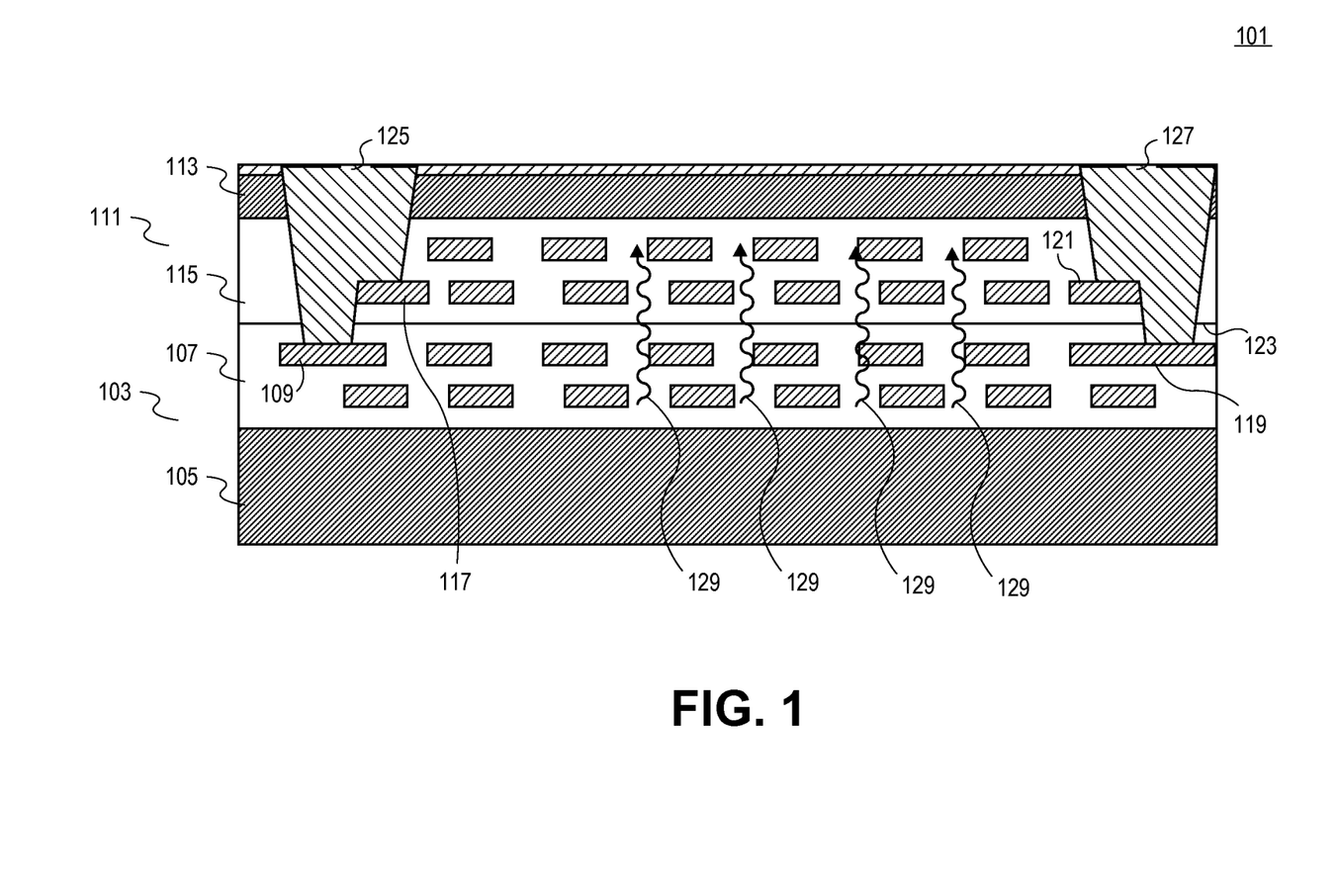
FIG. 1 is a cross-section diagram illustrating an example of first and second device wafers that are stacked and bonded together in an example integrated circuit system.

To illustrate, FIG. 1 is a diagram illustrating an example integrated circuit system 101 with stacked integrated circuit device wafers. As shown, integrated circuit system 101 includes a first device wafer 103 that is bonded to a second device wafer 111. First device wafer 103 includes a first semiconductor layer 105 and a first metal layer formed within a first metal layer oxide 107. In the example, conductors 109 and 119 are illustrated as being included in the first metal layer formed within the first metal layer oxide 107. Second device wafer 111 includes a having a second semiconductor layer 113 and a second metal layer formed within a second metal layer oxide 115. In the example, conductors 117 and 121 are illustrated as being included in the second metal layer formed within the second metal layer oxide 115. FIG. 1 also illustrates that conductive path 125 couples conductor 109 to conductor 117 and that conductive path 127 couples conductor 119 to conductor 121.

In one example, conductive paths 125 and 127 are formed by inter-chip vias fabricated on a wafer-level. In one example, second device wafer 111 is thinned to thickness between 1-5 um. In the example, conductive paths 125 and 127 are formed with aspect ratios from 1-3 to couple first device wafer 103 to second device wafer 111. Due to the close proximity of first device wafer 103 to second device wafer 111, there is significant electrical interference or coupling between stacked first device wafer 103 to second device wafer 111, as illustrated with electromagnetic interference (EMI) 129. For purposes of this disclosure, the term EMI may be representative of electromagnetic interference, electrical interference, electrical coupling, or the like, that occurs between the stacked integrated circuit wafers in accordance with the teachings of the present invention. Thus, it is appreciated that EMI 129 can cause undesirable effects and affect normal performance of first device wafer 103 and second device wafer 111. For example, if first device wafer 103 and second device wafer 111 are used to provide an image sensor, EMI 129 may introduce fixed pattern noise in the image sensor.

Figure 2:
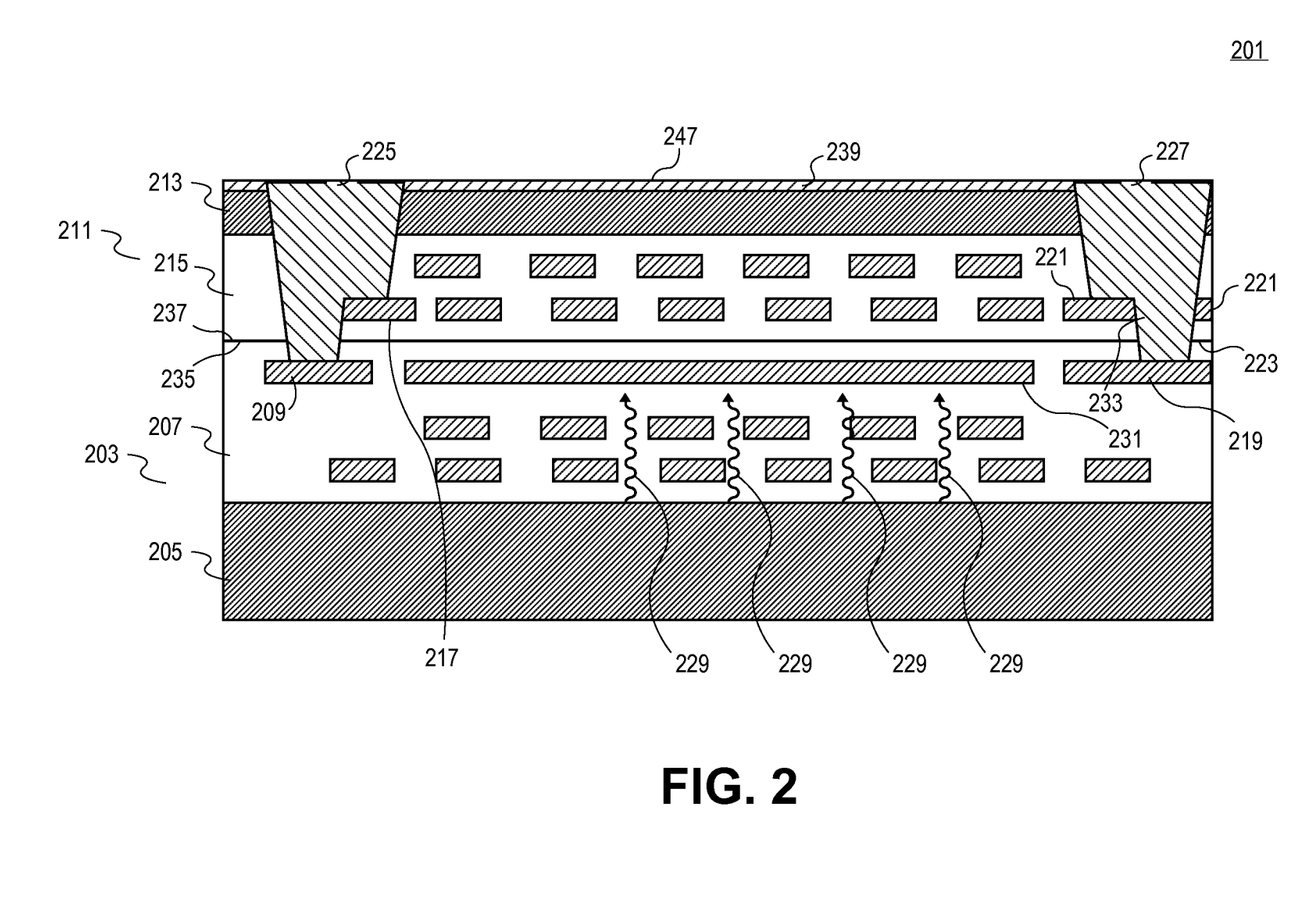
FIG. 2 is a cross-section diagram illustrating an example of an integrated circuit system having first and second device wafers that are stacked and bonded together in an example integrated circuit system including integrated electromagnetic interference (EMI) shielding accordance with the teachings of the present invention.

FIG. 2 is a cross-section diagram illustrating an example of an integrated circuit system 201 having first and second device wafers that are stacked and bonded together in an example integrated circuit system including integrated EMI shielding in accordance with the teachings of the present invention. As shown in the depicted example, integrated circuit system 201 includes a first device wafer 203 having a first semiconductor layer 205 and a first metal layer disposed within a first metal layer oxide 207. Integrated circuit system 201 also includes a second device wafer 211 having a second semiconductor layer 213 and a second metal layer disposed within second metal layer oxide 215. In one example, first device wafer 203 includes an imager chip and second device wafer 211 includes a processing chip coupled to the imager chip. In one example, first semiconductor layer 205 includes silicon and second semiconductor layer includes thinned silicon.

As shown in the depicted example, the first metal layer disposed within first metal layer oxide 207 includes a conductor 209 and a conductor 219. The illustrated example also shows that the second metal layer disposed within second metal layer oxide 207 includes a conductor 217 and a conductor 221. In the example illustrated in FIG. 2, a frontside 235 of the first metal layer oxide 207 of the first device wafer 203 is bonded to a frontside 237 of the second metal layer oxide 215 of the second device wafer 211 at a bonding interface 223 between the first metal layer oxide 207 and the second metal layer oxide 215. In one example, a conductive path 225 couples conductor 209 to conductor 217. In one example, a conductive path 227 couples conductor 219 to the conductor 221.

In one example, conductive paths 225 and 227 are formed by inter-chip vias fabricated on a wafer-level. For instance, conductive path 225 is formed in one example in a cavity etched between conductor 209 and conductor 227 and etched through bonding interface 223 and through second semiconductor layer 213 and through a passivation layer 247 from a backside 247 of second device wafer 211. In one example, conductive path 227 is further formed in a cavity etched through a hole 233 defined in the second conductor 221 and etched through bonding interface 223 and through the second semiconductor layer 213 and through passivation layer 247 from backside 247 of second device wafer 211.

In the example illustrated in FIG. 2, an EMI shield 231 is disposed in first metal oxide layer 207. In one example, EMI shield 231 is metal and is included in a metal layer disposed in the first metal oxide layer 207 that is nearest to the bonding interface 223 as shown. In one example, EMI shield 231 is included in the same metal layer as conductors 209 and/or 219, as shown in FIG. 2. In one example, there is an electrical coupling between EMI shield 231 and conductor 209 and/or conductor 219, which may improve the electrical interference shielding performance of EMI shield 231. In another example, it is appreciated that EMI shield 231 may be included in a metal layer disposed in second metal oxide layer 215. In the particular example illustrated in FIG. 2, there is a separation in second metal oxide layer 215 between EMI shield 231 and bonding interface 223. Thus, in the depicted example, bonding interface 223 is an oxide-to-oxide interface between the first metal layer oxide 207 of first device wafer 203 and the second metal layer oxide 215 of second device wafer 211.

Thus, with the inclusion of EMI shield 231 in integrated system 201, even with the close proximity of first device wafer 203 to second device wafer 211, the EMI 229 that is generated in first device wafer 203 is shielded from affecting normal performance of second device wafer 211 in accordance with the teachings of the present invention as shown. Therefore, in an example integrated system 201 in which first device wafer 203 and second device wafer 211 are used to provide an image sensor, fixed pattern noise that could have been caused by EMI 229 is reduced or eliminated in accordance with the teachings of the present invention.

Figure 3:
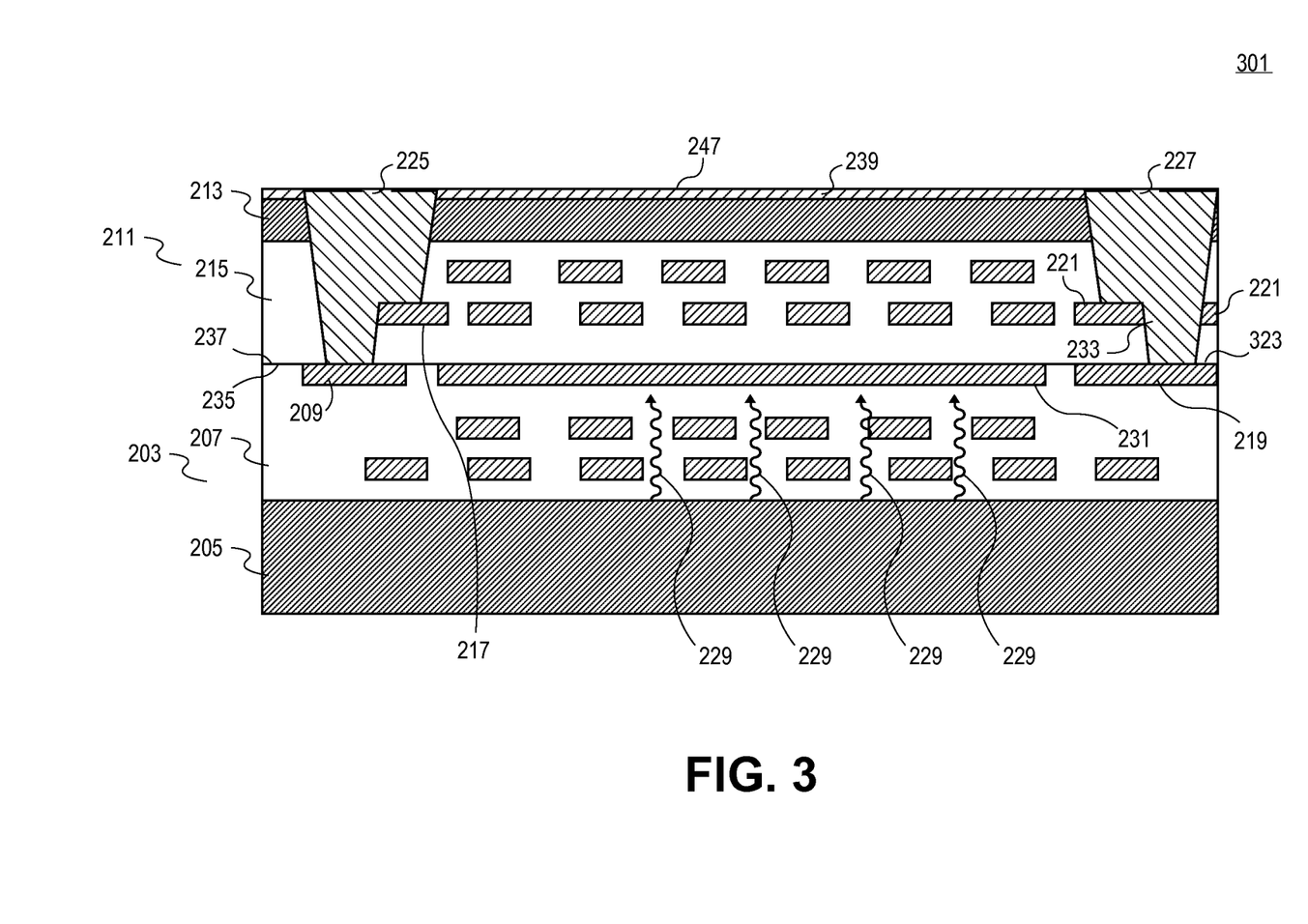
FIG. 3 is a cross-section diagram illustrating another example of an integrated circuit system having first and second device wafers that are stacked and bonded together in an example integrated circuit system including integrated EMI shielding accordance with the teachings of the present invention.

FIG. 3 is a cross-section diagram illustrating another example of an integrated circuit system 301 having first and second device wafers that are stacked and bonded together in an example integrated circuit system including integrated EMI shielding accordance with the teachings of the present invention. It is appreciated that in the depicted example, integrated circuit system 301 of FIG. 3 shares similarities with integrated circuit system 201 of FIG. 2, and like elements have kept their former labels. For instance, as illustrated in the depicted example, integrated circuit system 301 includes a first device wafer 203 having a first semiconductor layer 205 proximate to a first metal layer including a conductor 209 and a conductor 219 disposed within a first metal layer oxide 207. A second device wafer 211 having a second semiconductor layer 213 proximate to a second metal layer including a conductor 217 and a conductor 221 disposed within a second metal layer oxide 215.

One difference between integrated circuit system 301 of FIG. 3 and integrated circuit system 201 of FIG. 2 is that EMI shield 231, conductor 209 and conductor 219 in integrated circuit system 301 of FIG. 3 are at the bonding interface 323 in integrated circuit system 301. In one example, conductor 209 and conductor 219 are not at the bonding interface 323. In an example in which EMI shield 231 is included in first metal layer oxide 207, bonding interface 323 includes an oxide-to-metal bonding interface that includes at least the bonding of metal EMI shield 231 with the oxide of second metal layer oxide 215 as shown. In another example in which EMI shield 231 is included in second metal layer oxide 215, bonding interface 323 includes an oxide-to-metal bonding interface that includes at least the bonding of metal EMI shield 231 with the oxide of first metal layer oxide 207.

Therefore, in the example, the frontside 235 of the first metal layer oxide 207 of the first device wafer 203 is bonded to the frontside 237 of the second metal layer oxide 215 of the second device wafer 211 at the bonding interface 323 between the first device wafer 203 and the second device wafer 211. Conductive path 225, which couples the conductor 209 to the conductor 217, is formed in a cavity etched between conductor 209 and conductor 217 and etched through the bonding interface 323 and through the second semiconductor layer 213 from a backside 247 of the second device wafer 211. Conductive path 227, which couples the conductor 219 to the conductor 221, is formed in a cavity etched between conductor 219 and conductor 221 and etched through the bonding interface 323 and through the second semiconductor layer 213 from the backside 247 of the second device wafer 211.

Figure 4:
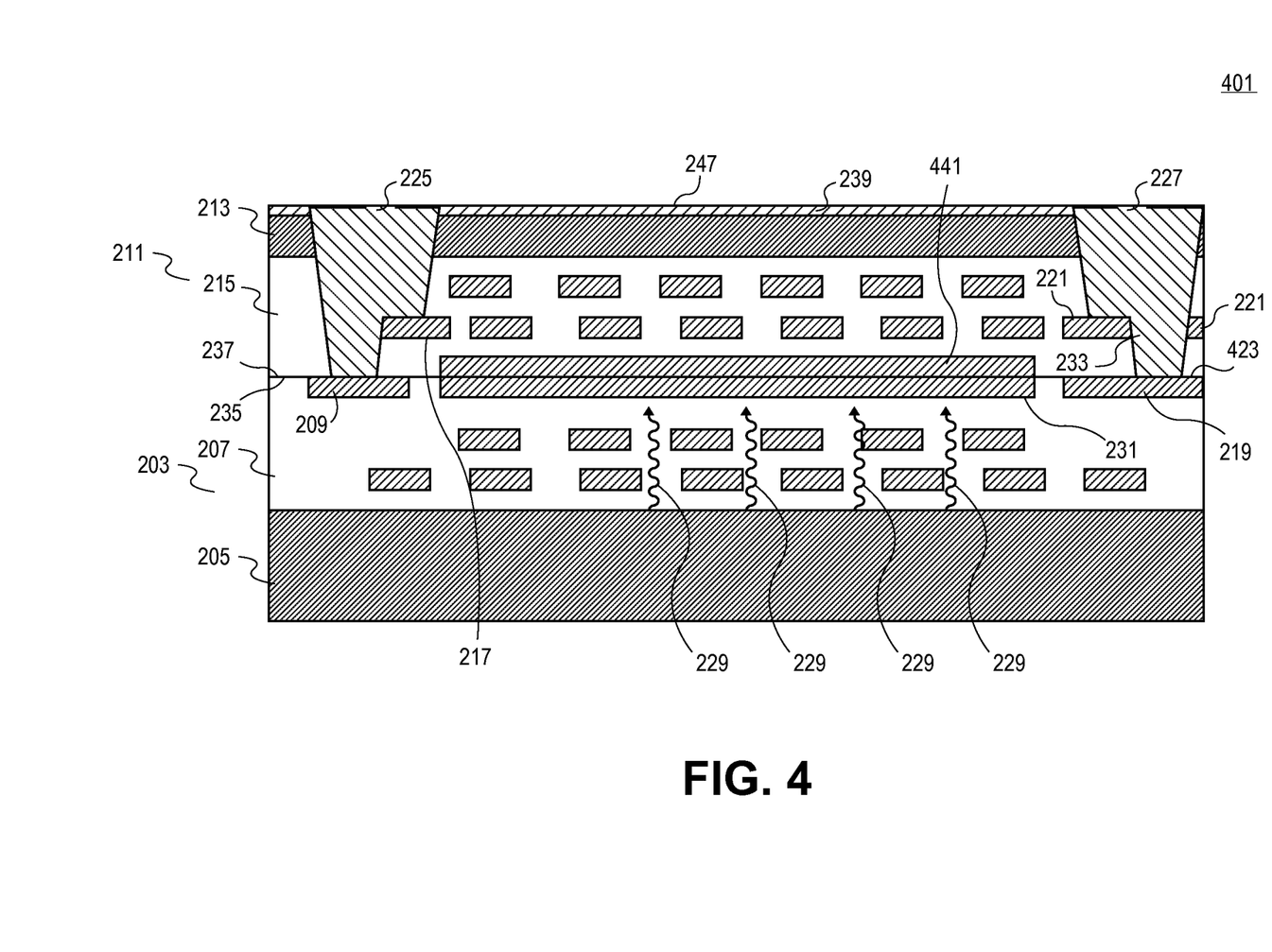
FIG. 4 is a cross-section diagram illustrating yet another example of an integrated circuit system having first and second device wafers that are stacked and bonded together in an example integrated circuit system including integrated EMI shielding accordance with the teachings of the present invention.

FIG. 4 is a cross-section diagram illustrating yet another example of an integrated circuit system 401 having first and second device wafers that are stacked and bonded together in an example integrated circuit system including integrated EMI shielding accordance with the teachings of the present invention. It is appreciated that in the depicted example, integrated circuit system 401 of FIG. 4 shares similarities with integrated circuit system 201 of FIG. 2 and integrated circuit system 301 of FIG. 3, and like elements have kept their former labels. For instance, as illustrated in the depicted example, integrated circuit system 401 includes a first device wafer 203 having a first semiconductor layer 205 proximate to a first metal layer including conductor 209 and conductor 219 disposed within a first metal layer oxide 207. A second device wafer 211 having a second semiconductor layer 213 proximate to a second metal layer including a conductor 217 and a conductor 221 disposed within a second metal layer oxide 215.

One difference between integrated circuit system 401 of FIG. 4 and integrated circuit system 301 of FIG. 3 is that an additional EMI shield 441 is included in the second metal layer oxide 215 of second device wafer 211 at the bonding interface 423 as shown. Accordingly, bonding interface 423 includes a metal-to-metal bonding interface that includes the bonding of metal EMI shield 231 to metal EMI shield 441 as shown. In one example, the metal EMI shields 231 and 442 have a large bonding surface area and therefore strengthen the wafer bonding between first device wafer 203 and second device wafer 211 in accordance with the teachings of the present invention.

Figure 5:
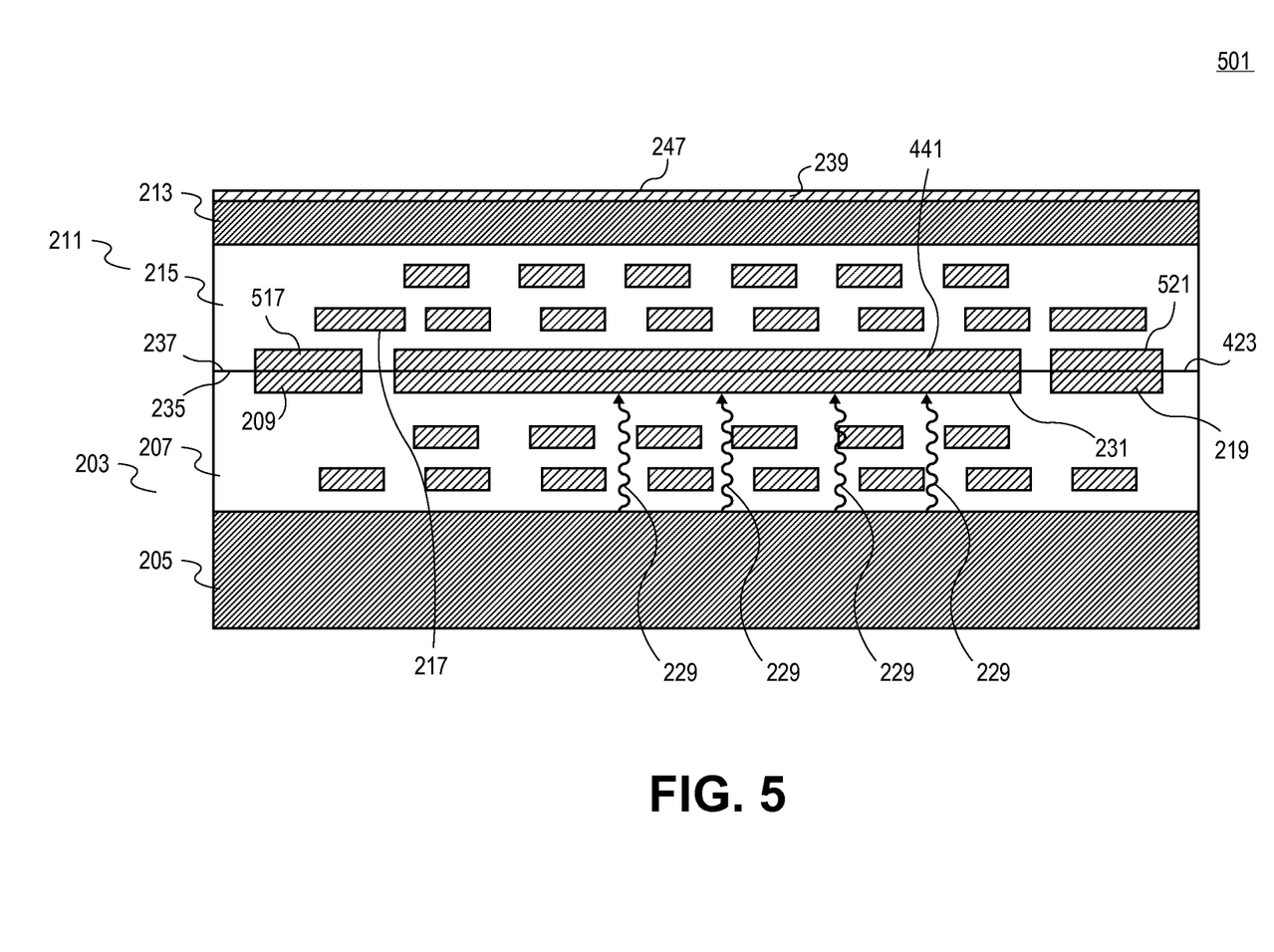
FIG. 5 is a cross-section diagram illustrating still another example of an integrated circuit system having first and second device wafers that are stacked and bonded together in an example integrated circuit system including integrated EMI shielding accordance with the teachings of the present invention.

FIG. 5 is a cross-section diagram illustrating still another example of an integrated circuit system 501 having first and second device wafers that are stacked and bonded together in an example integrated circuit system including integrated EMI shielding accordance with the teachings of the present invention. It is appreciated that in the depicted example, integrated circuit system 401 of FIG. 4 shares similarities with integrated circuit system 201 of FIG. 2, integrated circuit system 301 of FIG. 3, and integrated circuit system 401 of FIG. 4, and like elements have kept their former labels. For instance, as illustrated in the depicted example, integrated circuit system 501 includes a first device wafer 203 having a first semiconductor layer 205 proximate to a first metal layer including a conductor 209 and a conductor 219 disposed within a first metal layer oxide 207. A second device wafer 211 having a second semiconductor layer 213 proximate to a second metal layer including a conductor 517 and a conductor 521 disposed within a second metal layer oxide 215.

One difference between integrated circuit system 501 of FIG. 5 and integrated circuit system 401 of FIG. 4 is that conductor 517 and conductor 521, which are included in the second metal layer oxide 215 of second device wafer 211, are located at the bonding interface 423 as shown. Accordingly, bonding interface 423 includes a metal-to-metal bonding interfaces that include the bonding of conductor 209 to conductor 517, the bonding of conductor 219 to conductor 521, and the bonding of metal EMI shield 231 to metal EMI shield 441 as shown. In one example, the combined bonding surface areas of conductors 209, 517, 219 and 521 and metal EMI shields 231 and 442 are relatively large and therefore strengthen the wafer bonding between first device wafer 203 and second device wafer 211 in accordance with the teachings of the present invention.

Figure 6:
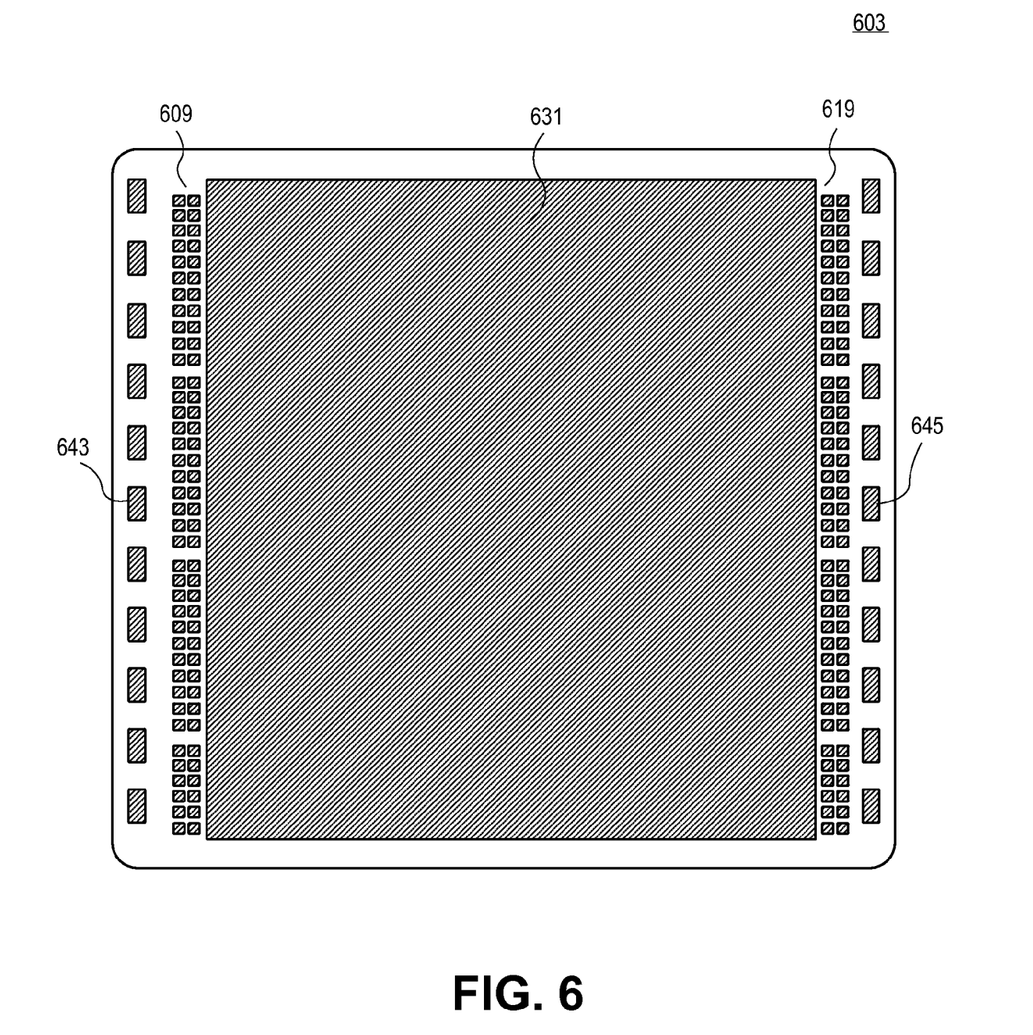
FIG. 6 is a illustrates an example top view of a stacked chip having a top metal layer that includes an example metal shield that is a solid piece in accordance with the teachings of the present invention.

FIG. 6 is a illustrates an example top view of a device wafer 603 having a top metal layer that includes an example metal shield that is a solid piece in accordance with the teachings of the present invention. In the example illustrated in FIG. 6, chip 603 may correspond for example with at least first device wafer 203 of FIGS. 3-5. As shown in the depicted example, a top view of device wafer 603 is shown including an EMI shield 631 with inter-chip bonding pads 609 and 619 as well as external bonding pads 643 and 645, which are disposed in a top metal layer of device wafer 603. In one example, EMI shield 631 includes metal and is a solid piece as illustrated.

Figure 7:
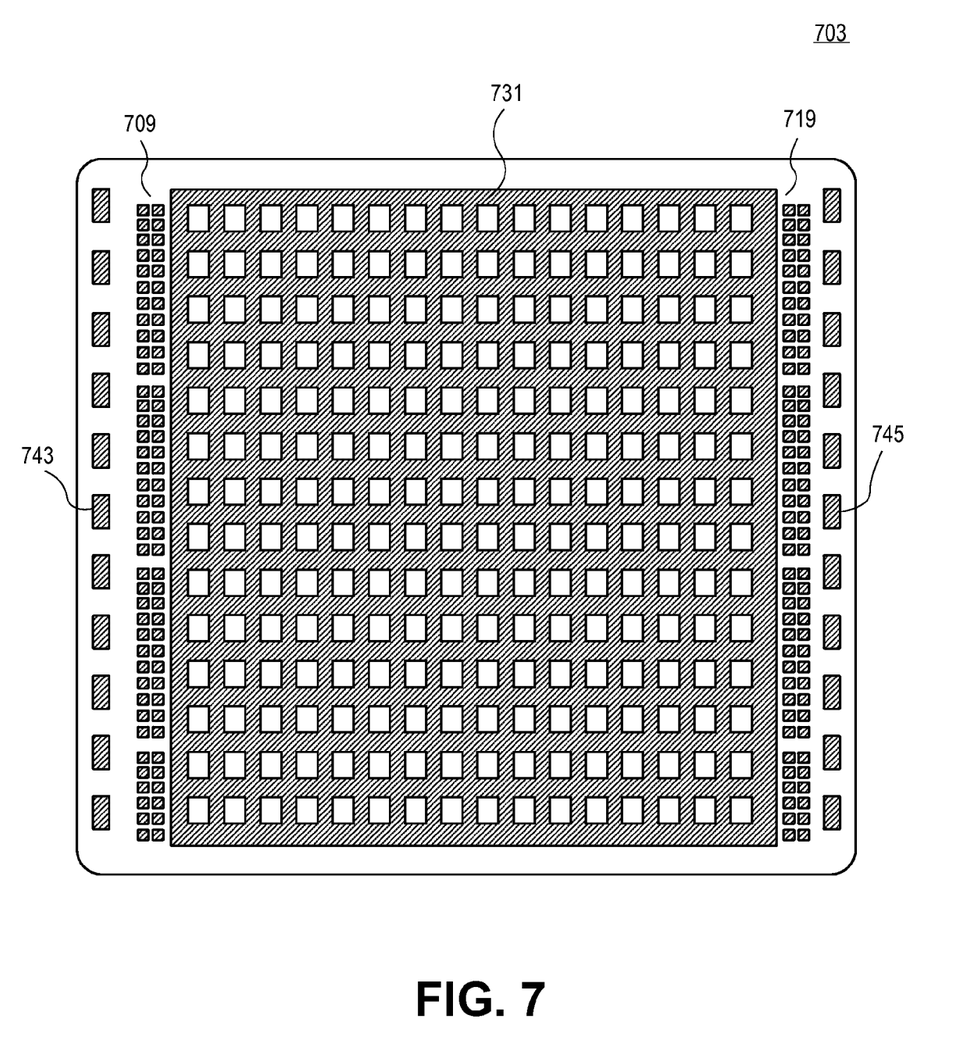
FIG. 7 is a illustrates another example top view of a stacked chip having a top metal layer that includes an example metal shield that is a metal grid in accordance with the teachings of the present invention.

FIG. 7 is a illustrates another example top view of a device wafer 703 having a top metal layer that includes an example metal shield that is a metal grid in accordance with the teachings of the present invention. In the example illustrated in FIG. 7, chip 703 may correspond for example with at least first device wafer 203 of FIGS. 3-5. As shown in the depicted example, a top view of device wafer 703 is shown including an EMI shield 731 with inter-chip bonding pads 709 and 719 as well as external bonding pads 743 and 745, which are disposed in a top metal layer of device wafer 603. In one example, EMI shield 731 includes metal and is a metal grid as illustrated.

In one example, the metal grid of EMI shield 731 is fabricated using copper damascene for top metal layer patterning. In one example, the openings of the metal grid of EMI shield 731 are substantially smaller than a wavelength of electrical interference generated within an integrated circuit system including device 703 in accordance with the teachings of the present invention.

Figure 8:
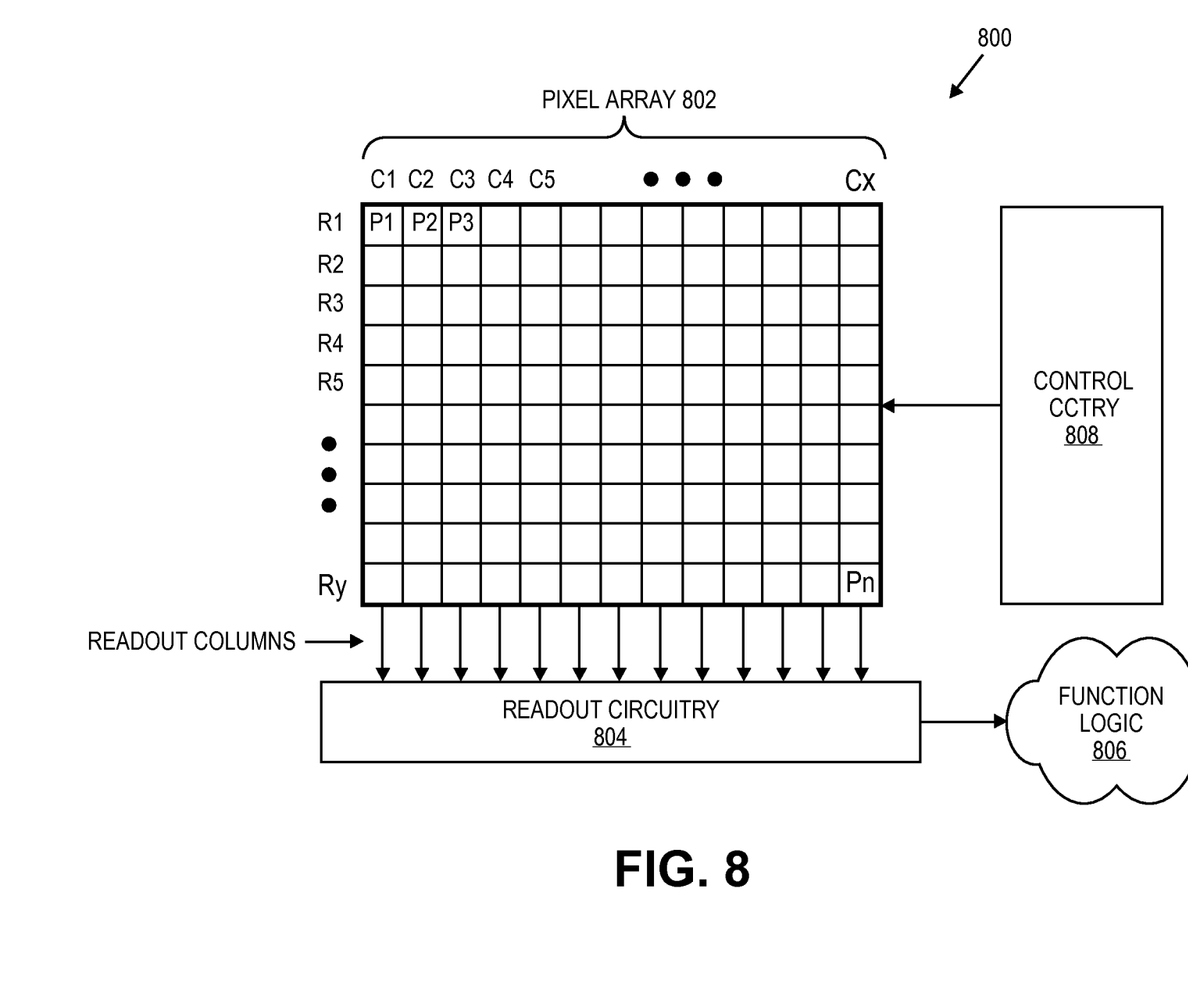
FIG. 8 is a diagram illustrating one example of an imaging system including a pixel array having image sensor pixels included in an integrated circuit system having integrated EMI shielding in accordance with the teachings of the present invention.

FIG. 8 is a diagram illustrating one example of an imaging system 800 including an example pixel array 802 having a plurality of image sensor pixels included in an example integrated circuit system featuring integrated EMI shielding in accordance with the teachings of the present invention. As shown in the depicted example, imaging system 800 includes pixel array 802 coupled to control circuitry 808 and readout circuitry 804, which is coupled to function logic 806.

In one example, pixel array 802 is a two-dimensional (2D) array of image sensor pixels (e.g., pixels P1, P2 . . . , Pn). In one example, pixel array 802 is included in an integrated circuit system, such as for example integrated circuit system 201, 302, 401 or 501, as discussed above in FIGS. 2-5. Therefore, pixel array 802 has substantially little or no fixed pattern noise that results from electrical interference or electrical coupling because of the integrated EMI shielding included in pixel array 802 in accordance with the teachings of the present invention. As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is readout by readout circuitry 804 and then transferred to function logic 806. In various examples, readout circuitry 804 may include amplification circuitry, analog-to-digital (ADC) conversion circuitry, or otherwise. Function logic 806 may simply store the image data or even manipulate the image data by applying post image effects (e.g., crop, rotate, remove red eye, adjust brightness, adjust contrast, or otherwise). In one example, readout circuitry 804 may readout a row of image data at a time along readout column lines (illustrated) or may readout the image data using a variety of other techniques (not illustrated), such as a serial readout or a full parallel readout of all pixels simultaneously.

In one example, control circuitry 808 is coupled to pixel array 802 to control operational characteristics of pixel array 502. For example, control circuitry 808 may generate a shutter signal for controlling image acquisition. In one example, the shutter signal is a global shutter signal for simultaneously enabling all pixels within pixel array 802 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An integrated circuit system, comprising:
a first device wafer having a first semiconductor layer proximate to a first metal layer including a first conductor disposed within a first metal layer oxide;
a second device wafer having a second semiconductor layer proximate to a second metal layer including a second conductor disposed within a second metal layer oxide, wherein a frontside of the first metal layer oxide of the first device wafer is bonded to a frontside of the second metal layer oxide of the second device wafer at a bonding interface between the first metal layer oxide and the second metal layer oxide, wherein one of the first device wafer and second device wafer comprises an imager chip and an other one of the first device wafer and second device wafer comprises a processing chip;
a conductive path coupling the first conductor to the second conductor, wherein the conductive path is formed in a cavity etched between the first conductor and the second conductor and etched through the bonding interface and through the second semiconductor layer from a backside of the second device wafer; and
a first metal electromagnetic interference (EMI) shield disposed in one of the first metal layer oxide and second metal layer oxide, wherein the first EMI shield is included in a metal layer of said one of the first metal layer oxide and the second metal layer oxide nearest to the bonding interface.

2. The integrated circuit system of claim 1 wherein the bonding interface comprises an oxide-to-oxide bonding interface between the first metal layer oxide and the second metal layer oxide.

3. The integrated circuit system of claim 1 wherein the bonding interface comprises an oxide-to-metal bonding interface between the first EMI shield and an other one of said one of the first metal layer oxide and second metal layer oxide.

4. The integrated circuit system of claim 1 further comprising a second metal EMI shield disposed in an other one of the first metal layer oxide and second metal layer oxide, wherein the second EMI shield is included in a metal layer of said other one of the first metal layer oxide and second metal layer oxide nearest to the bonding interface.

5. The integrated circuit system of claim 4 wherein the bonding interface includes a metal-to-metal bonding interface between the first metal EMI shield and the second metal EMI shield.

6. The integrated circuit system of claim 1 wherein the first metal EMI shield comprises a solid metal piece.

7. The integrated circuit system of claim 1 wherein the first metal EMI shield comprises a metal grid.

8. The integrated circuit system of claim 7 wherein openings in the metal grid are substantially smaller than a wavelength of electromagnetic interference to be generated within the integrated circuit system.

9. The integrated circuit system of claim 1 wherein the conductive path is formed through a hole defined in the second conductor.

10. The integrated circuit system of claim 1 wherein the first EMI shield is coupled to the first conductor.

11. An integrated circuit system, comprising:
a first device wafer having a first semiconductor layer proximate to a first metal layer including a first conductor disposed within a first metal layer oxide;
a second device wafer having a second semiconductor layer proximate to a second metal layer including a second conductor disposed within a second metal layer oxide, wherein one of the first device wafer and second device wafer comprises an imager chip and an other one of the first device wafer and second device wafer comprises a processing chip;
a first metal electromagnetic interference (EMI) shield disposed in the first metal layer oxide, wherein the first EMI shield is located at a frontside of the first metal layer oxide of the first device wafer; and
a second metal EMI shield disposed in the second metal layer oxide, wherein the second EMI shield is located at a frontside of the second metal layer oxide of the second device wafer, wherein the frontside of the first metal layer oxide of the first device wafer is bonded to the frontside of the second metal layer oxide of the second device wafer at a bonding interface such that the first EMI shield is bonded to the second EMI shield with a metal-to-metal bonding interface.

12. The integrated circuit system of claim 11 wherein further comprising a conductive path coupling the first conductor to the second conductor, wherein the conductive path is formed in a cavity etched between the first conductor and the second conductor and etched through the bonding interface and through the second semiconductor layer from a backside of the second device wafer.

13. The integrated circuit system of claim 11 wherein the first conductor is located at the frontside of the first metal layer oxide of the first device wafer and wherein the second conductor is located at the frontside of the second metal layer oxide of the second device wafer, wherein the first conductor is bonded to the second conductor with the metal-to-metal bonding interface.

14. The integrated circuit system of claim 11 wherein the first and second metal EMI shields comprise solid metal pieces.

15. The integrated circuit system of claim 11 wherein the first and second metal EMI shields comprise metal grids.

16. The integrated circuit system of claim 15 wherein openings in the first and second metal grids are substantially smaller than a wavelength of electromagnetic interference to be generated within the integrated circuit system.

17. An imaging system, comprising:
a pixel array having a plurality of image sensor pixels, wherein the pixel array is included in an integrated circuit system including:
a first device wafer having a first semiconductor layer proximate to a first metal layer including a first conductor disposed within a first metal layer oxide;
a second device wafer having a second semiconductor layer proximate to a second metal layer including a second conductor disposed within a second metal layer oxide, wherein a frontside of the first metal layer oxide of the first device wafer is bonded to a frontside of the second metal layer oxide of the second device wafer at a bonding interface between the first metal layer oxide and the second metal layer oxide, wherein one of the first device wafer and second device wafer comprises an imager chip and an other one of the first device wafer and second device wafer comprises a processing chip;
a conductive path coupling the first conductor to the second conductor, wherein the conductive path is formed in a cavity etched between the first conductor and the second conductor and etched through the bonding interface and through the second semiconductor layer from a backside of the second device wafer; and
a first metal electromagnetic interference (EMI) shield disposed in one of the first metal layer oxide and second metal layer oxide, wherein the first EMI shield is included in a metal layer of said one of the first metal layer oxide and the second metal layer oxide nearest to the bonding interface;
control circuitry coupled to the pixel array to control operation of the pixel array; and
readout circuitry coupled to the pixel array to readout image data from the plurality of image sensor pixels.

18. The imaging system of claim 17 further comprising function logic coupled to the readout circuitry to store the image data readout from the plurality of image sensor pixels.

19. The imaging system of claim 17 wherein the bonding interface comprises an oxide-to-oxide bonding interface between the first metal layer oxide and the second metal layer oxide.

20. The imaging system of claim 17 wherein the bonding interface comprises an oxide-to-metal bonding interface between the first EMI shield and an other one of said one of the first metal layer oxide and second metal layer oxide.

21. The imaging system of claim 17 further comprising a second metal EMI shield disposed in an other one of the first metal layer oxide and second metal layer oxide, wherein the second EMI shield is included in a metal layer of said other one of the first metal layer oxide and second metal layer oxide nearest to the bonding interface.

22. The imaging system of claim 21 wherein the bonding interface includes a metal-to-metal bonding interface between the first metal EMI shield and the second metal EMI shield.

23. The imaging system of claim 17 wherein the first metal EMI shield comprises a solid metal piece.

24. The imaging system of claim 17 wherein the first metal EMI shield comprises a metal grid.

25. The imaging system of claim 24 wherein openings in the metal grid are substantially smaller than a wavelength of electromagnetic interference to be generated within the integrated circuit system.

* * * * *